(12) United States Patent
Tseng et al.

(10) Patent No.: US 7,341,929 B2
(45) Date of Patent: Mar. 11, 2008

(54) METHOD TO FABRICATE PATTERNED STRAIN-RELAXED SIGE EPITAXIAL WITH THREADING DISLOCATION DENSITY CONTROL

(75) Inventors: Yang-Tai Tseng, Hsinchu (TW); Pang-Shiu Chen, Hsinchu (TW); Shin-Chi Lu, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 113 days.

(21) Appl. No.: 10/887,186

(22) Filed: Jul. 9, 2004

(65) Prior Publication Data

US 2005/0176217 A1    Aug. 11, 2005

(30) Foreign Application Priority Data

Feb. 6, 2004    (TW) .............................. 93102861 A

(51) Int. Cl.
*H01L 21/20* (2006.01)
(52) U.S. Cl. ................... 438/506; 257/E21.103
(58) Field of Classification Search ................ 438/478, 438/514, 499, 505, 506; 257/E21.103
See application file for complete search history.

(56) References Cited

U.S. PATENT DOCUMENTS

| | | | |
|---|---|---|---|
| 6,291,321 B1 | 9/2001 | Fitzgerald | |
| 6,515,335 B1 | 2/2003 | Christiansen et al. | |
| 6,852,604 B2* | 2/2005 | Baba | 438/373 |
| 2004/0241459 A1* | 12/2004 | Bedell et al. | 428/446 |
| 2006/0022200 A1* | 2/2006 | Shiono et al. | 257/65 |

OTHER PUBLICATIONS

S. Wolf and R.N. Tauber, Silicon Processing for the VLSI Era, vol. 1, 2nd edition, Lattice Press, 2000, pp. 488-489.*

* cited by examiner

*Primary Examiner*—Stephen W. Smoot
(74) *Attorney, Agent, or Firm*—Morris Manning Martin LLP; Tim Tingkang Xia, Esq.

(57) ABSTRACT

A method to fabricate patterned strain-relaxed SiGe epitaxial with threading dislocation density control is provided. An ion-implanting area is first defined on a silicon substrate, and then proceeds ion-implanting. Finally, a buffer layer and a SiGe epitaxial layer are deposited. According to the disclosure, an active area and a non-active area are defined through ion-implanting. Therefore, the threading dislocation occurring in the active area concentrates in the non-active area, and the density of the threading dislocation is lowered. Furthermore, the performance of the semiconductor is also enhanced.

16 Claims, 4 Drawing Sheets

US 7,341,929 B2

METHOD TO FABRICATE PATTERNED STRAIN-RELAXED SIGE EPITAXIAL WITH THREADING DISLOCATION DENSITY CONTROL

This Non-provisional application claims priority under 35 U.S.C. § 119(a) on Patent Application No(s). 093102861 filed in Taiwan on Feb. 6, 2004, the entire contents of which are hereby incorporated by reference.

BACKGROUND OF THE INVENTION

1. Field of Invention

The present invention relates to a method to fabricate strain-relaxed SiGe layers, and more particularly to a method to fabricate a patterned strain-relaxed SiGe epitaxy with threading dislocation density control.

2. Related Art

The semiconductor and integrated circuit technology has been developed to be compact with high operation speed in recent years. How to increase the operation speed of the semiconductor device and lower power consumption constitutes an important issue in the very large scale integration (VLSI) field.

Researches on SiGe material have shown that deposition of a strained Si after depositing a strain-relaxed SiGe layer on a silicon substrate, increases electron shift mobility in a channel of the semiconductor device and, consequently, the semiconductor device performance.

U.S. Pat. No. 6,515,335 discloses a Ge wetting layer formed on a silicon-on-insulator (SOI). A SiGe island-shaped layer is then formed on the Ge wetting layer. A planarized SiGe layer is formed to cover the SiGe island-shaped layer. After a thermal treatment is performed, diffusion occurs among the silicon layer on the SOI, the SiGe island-shaped layer and the planarized SiGe layer, to form a uniform low-strain SiGe layer on the oxide layer. The threading dislocation occurs on the SiGe layer close to the oxide layer, so there is no cell dislocation on the topmost SiGe layer.

U.S. Pat. No. 6,291,321 discloses a process of forming gradual Ge layers at different temperatures. Cell dislocation at interfaces between the layers increases, due to the roughness of the interfaces. In the disclosure of this patent, the roughness of the interfaces is reduced by performing a chemical mechanical polishing process in patent 321, which results in a reduction of cell dislocation. However, the occurrence location of the dislocation cannot be control.

Current technology trends now are focusing on the formation of gradual Ge layers with low threading dislocation where dislocation is well controlled. A main SiGe layer is formed on the gradual Ge layer. Therefore, this structure doesn't have defects caused by large strain variation of lattices. Thereby, relaxation of lattices increases. This structure is applied in a strained Si/Sige CMOS manufacture process.

However, the manufacture process still leads to high threading dislocation density and is not good for ICs manufacturing. Large current leakage and low carrier shift mobility occurs to threading dislocation.

In view of the current need for semiconductor devices, a higher Ge content leads to faster speed and better performance. However, high threading dislocation density because of the thickness of the epitaxial layer occurs. For the foregoing reasons, there is a need for SiGe epitaxial layers with low threading dislocation density.

SUMMARY OF THE INVENTION

Accordingly, the present invention is directed to a method to fabricate a patterned strain-relaxed SiGe epitaxy with threading dislocation density control that substantially obviates one or more of the problems, due to limitations and disadvantages of the related art.

According to the principle of the invention, an active area and a non-active area are defined through ion implanting. Then a strain-relaxed SiGe epitaxial layer is deposited. After annealing the epitaxial layer, the threading dislocation density, and relaxation level are improved in the active areas similar to the MESA construction.

To achieve these and other advantages and in accordance with the purpose of the present invention, as embodied and broadly described, the method to fabricate patterned strain-relaxed SiGe epitaxy with threading dislocation density control, for example, includes steps of defining an ion-implanting area on a silicon substrate, and then proceeds ion-implanting in the ion-implanted area. Finally, a buffer layer and a SiGe epitaxial layer are deposited.

According to an aspect of the invention, an advantage of the invention provides a better strain-relaxed SiGe epitaxial layer to improve the carrier shift mobility of the channel of the strained silicon. The conventional method to deposit a gradual SiGe epitaxial layer results in threading dislocation at random. However, employing ion implanting to define the active area and the non-active area results in concentration of the threading dislocation of the active areas in the non-active area. Therefore, the method according to the aspect of the invention is helpful for the performance enhancement of semiconductor devices.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given in the illustration below only, and is thus not limitative of the present invention, wherein.

DETAILED DESCRIPTION OF THE INVENTION

Figure 1:
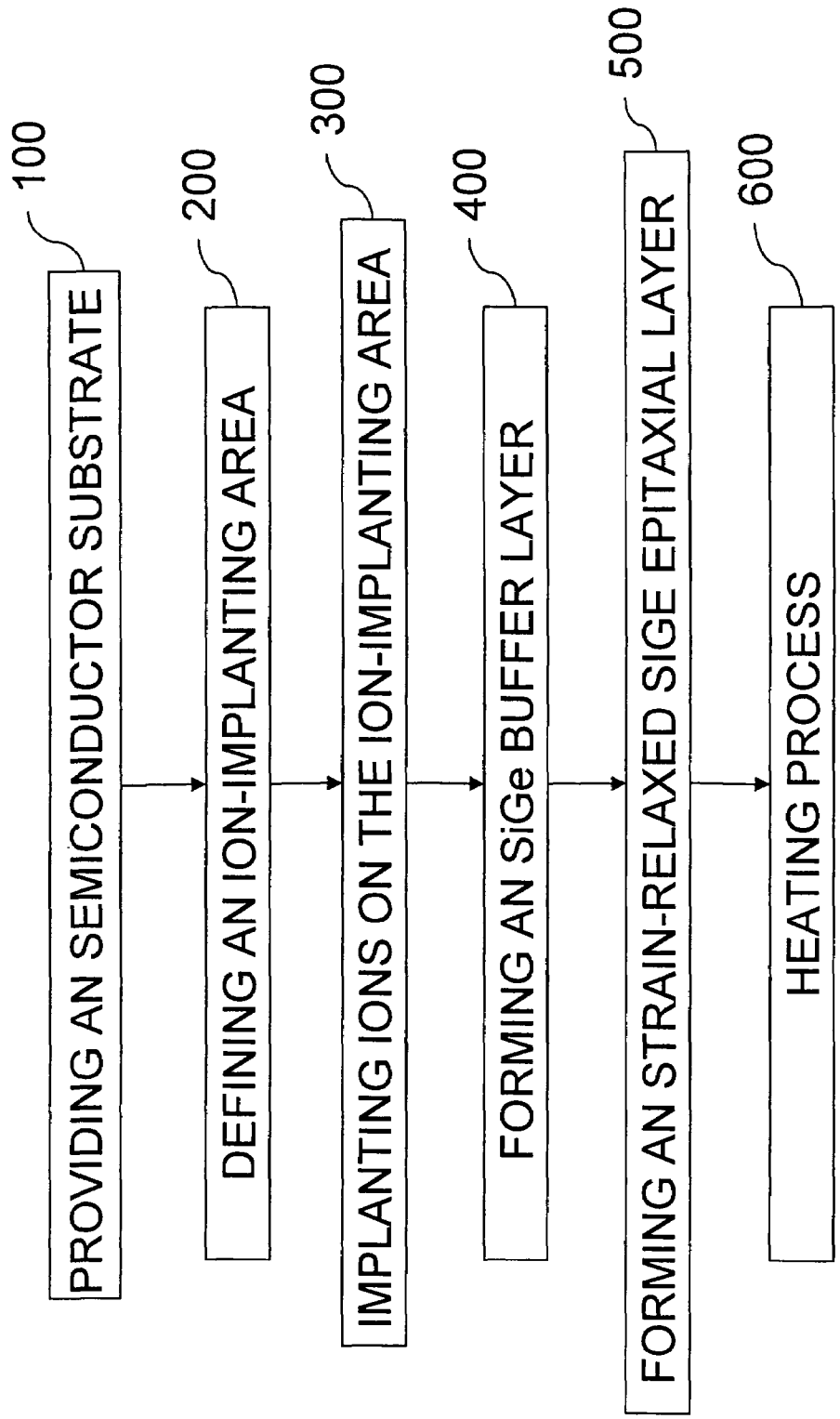
FIG. 1 illustrates the fabricating process of patterned strain-relaxed SiGe epitaxy with threading dislocation density control according to the invention.

Refer to FIG. 1, illustrating the fabricating process of patterned strain-relaxed SiGe epitaxy with threading dislocation density control according to the version of the invention. Steps of the process can be performed in different sequences, or some of the steps can be omitted, or performed simultaneously. The sequence and number of steps are not particularly limited to those described in the following embodiments.

The ion-implanting area is defined through using a photo mask. Then, a gradual SiGe epitaxial layer (content around 0~20%) is deposited by super vacuum chemical vapor deposition and an appropriate heating process. The non ion-implanting areas are used to fabricate semiconductor components.

In the beginning, a semiconductor substrate is provided (step 100). Then a photo mask is employed to define an ion-implanting area (step 200). The ion-implanting area is a non active area while the non ion-implanting area is an active area. Then, an ion implanting process is performed in the defined ion-implanting area (step 300). After ion implanting, a SiGe buffer (step 400) and a strain-relaxed SiGe epitaxial layer (step 500) are deposited. Finally, an appropriate heating process, for example, annealing process, is conducted for finishing the strain-relaxed SiGe epitaxial layer.

After forming SiGe epitaxial layers on the ion-implanted area and defect etching, pattern-like structures occur on the top surface. Because of damage in the non active area, the threading dislocation of the active area treated by the heating process concentrates in the non active area, and thereby an appropriate strain-relaxed SiGe epitaxial is formed. After a heating treatment in step 600, a better strain-relaxed level is obtained.

Step 200 uses a photo mask to define whether areas are ion-implanted. In step 500, deposition of the SiGe epitaxial layer may be, for example, crystallized. Deposition of the SiGe epitaxial layer can be performed via a super vacuum chemical vapor deposition. A molecule beam epitaxy growth, a low pressure vapor deposition (LPVCD) or a rapid thermal chemical vapor deposition (RTVCD) can be performed likewise.

Figure 2A:
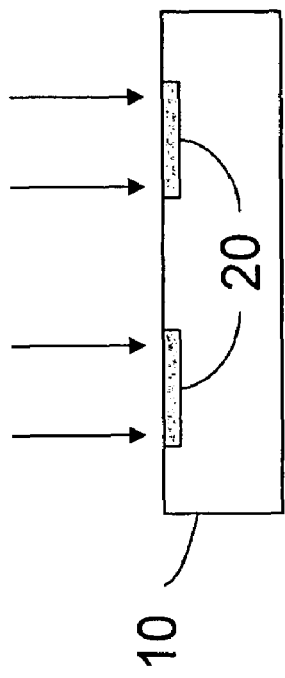
FIG. 2A~FIG. 2C illustrates the perspective sectional view of the patterned strain-relaxed SiGe epitaxy with threading dislocation density control according to the invention.
Figure 2B:
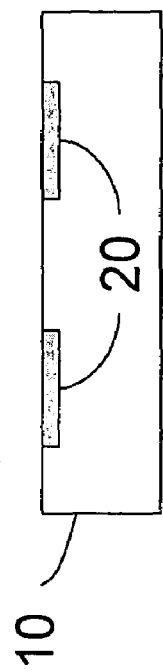
Figure 2C:
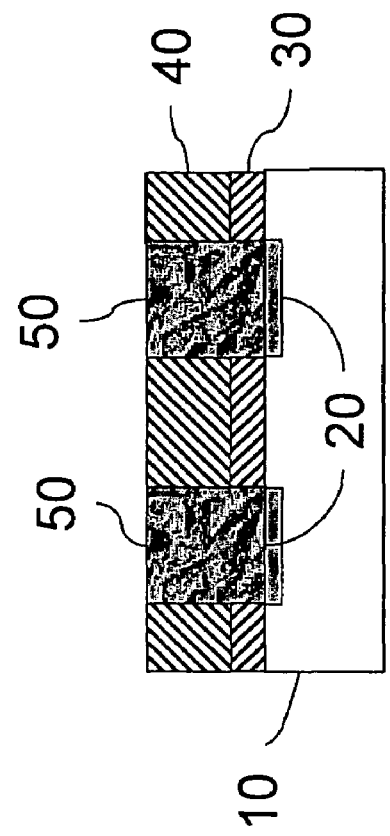

FIG. 2A~FIG. 2C illustrate the perspective sectional view of the patterned strain-relaxed SiGe epitaxy with threading dislocation density control according to the invention. Exposure and development processes are conducted via a photo mask for forming an ion-implanting area 20 on a silicon substrate 10. The ion-implanting area 20 is used for a non-active area. Then, an ion-implanting process is conducted in the ion-implanting area 20.

The following process proceeds to deposit a first SiGe buffer layer 30 on the silicon substrate 10 and the ion-implanting area 20, then to a second SiGe buffer layer 40 on the first SiGe buffer layer 30. The first SiGe buffer layer 30 is formed under low temperatures, while the second SiGe buffer layer 40 is formed by depositing gradual Ge under high temperatures. Deposition of the SiGe epitaxial layer can be performed via a super vacuum chemical vapor deposition, a molecule beam epitaxy growth, a low pressure vapor deposition (LPVCD) or a rapid thermal chemical vapor deposition (RTVCD). The average content of the second SiGe buffer 40 is around 0% to 20%. The Ge ratio and the thickness of the SiGe layer can be varied as desired. The second SiGe buffer layer 40 may be deposited layer by layer, in which the Ge content gradually increases.

According to the principle of the invention, after deposition of the second SiGe buffer layer 40 is finished, destruction in the non-active areas caused by the ion-implanting area 20 results in a patterned surface and structure on the SiGe epitaxial structure formed on the ion-implanting area 20. In other words, a strain-relaxed SiGe epitaxial layer with patterns occurs in the epitaxial layer. Furthermore, the epitaxial structure may be processed with a heating process for a higher strain-relaxed level.

In the structure illustrated in FIG. 2, the SiGe epitaxial layer 50 is formed through the first SiGe buffer layer 30 and the second SiGe buffer 40. For example, the SiGe epitaxial layer 50 may be formed through one SiGe buffer layer, which is deposited by gradual Ge.

Figure 3:
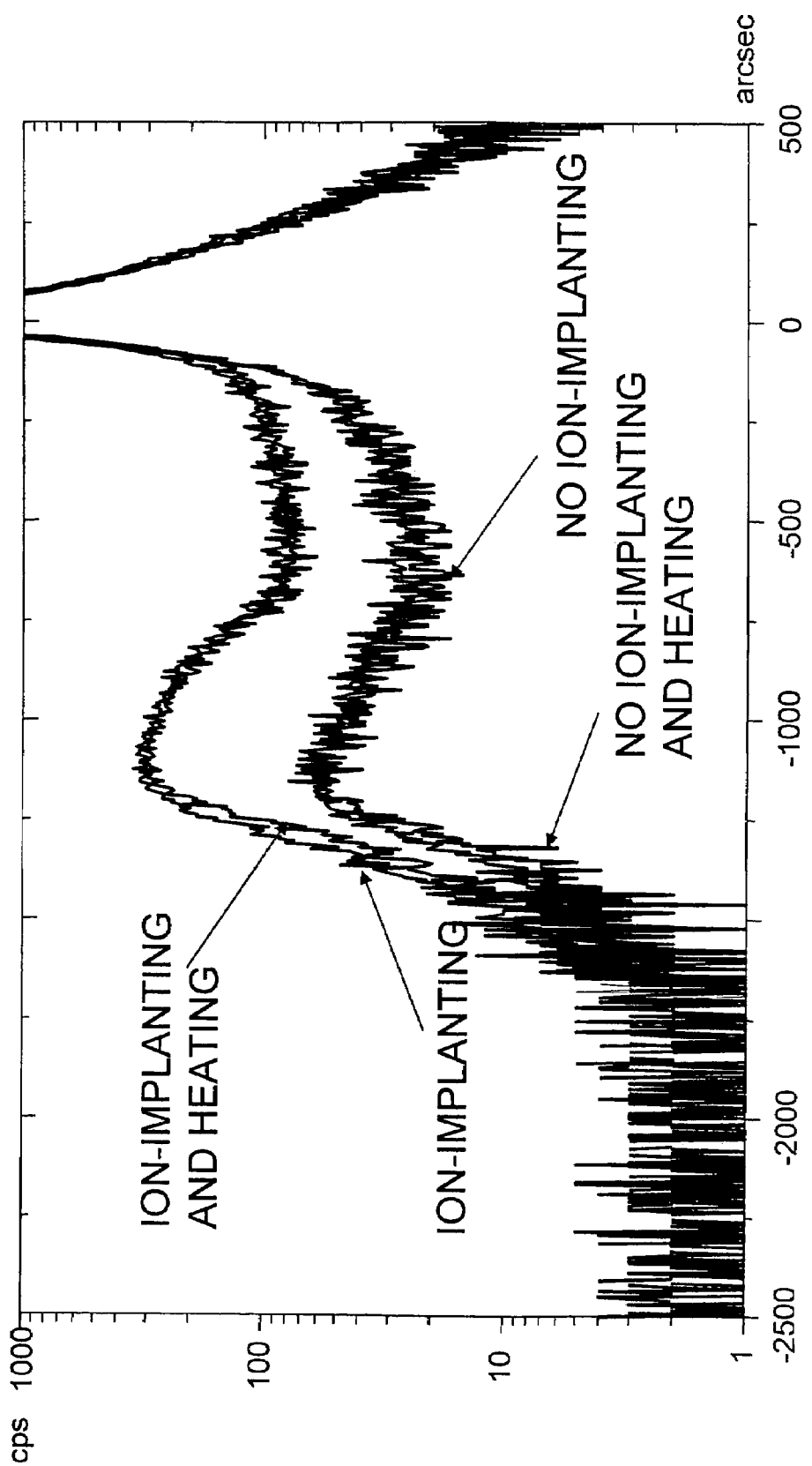
FIG. 3 illustrates the X-ray Diffraction (XRD) figures of the epitaxial layers fabricated according to the invention and the prior art respectively.

FIG. 3 illustrates the X-ray Diffraction (XRD) figures of the epitaxial layers fabricated according to the version of the invention and the prior art respectively. It is shown that the relax level of the lattice in the ion-implanted area is grater than that in non ion-implanted area. Furthermore, the relax level of the lattice in the ion-implanted area is also better. Therefore, according to the principle of the invention, the relax level of the lattice in the ion-implanted area is better than the prior art.

Figure 4:
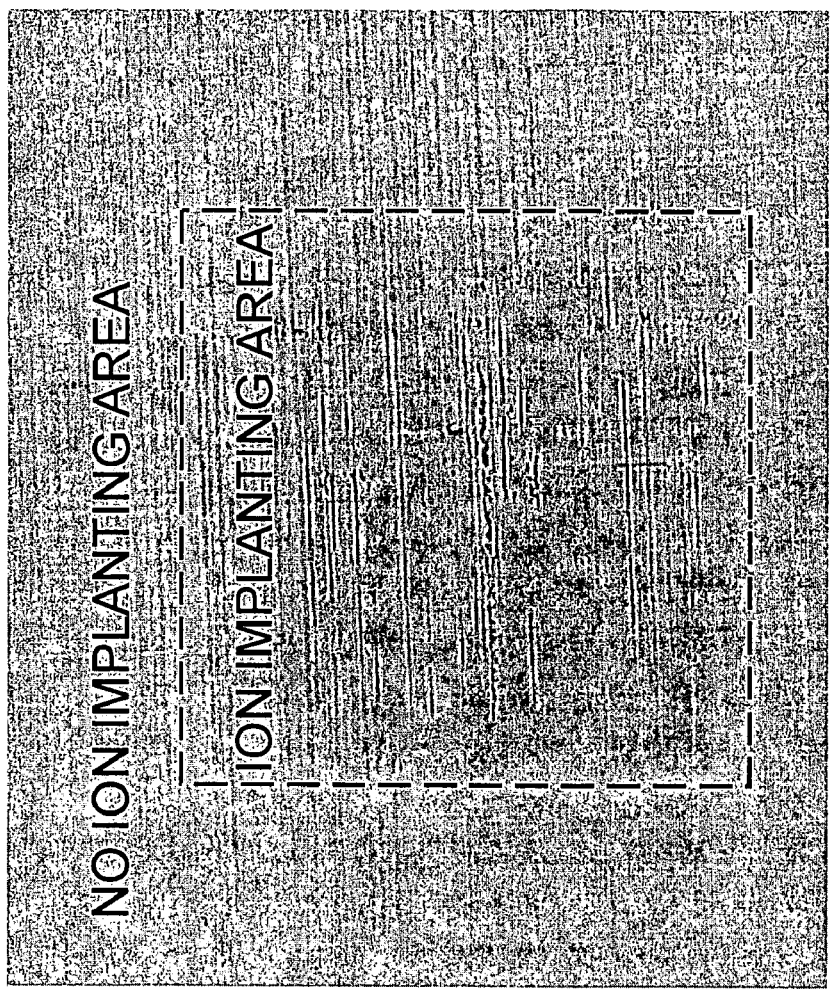
FIG. 4 is the picture of the patterned strain-relaxed SiGe epitaxy with threading dislocation density control according to the invention.

FIG. 4 is the picture of the patterned strain-relaxed SiGe epitaxial with threading dislocation density control according to the invention. As shown in the figure, after defect etching and heating treatment of 900 degrees and 180 seconds, the threading dislocation occurs in the ion-implanting area indeed. The picture is taken by a 500× optical microscope after the structure is defect etched. The dotted squared area in the figure is 36.5 um by 44.55 um. Inside the area is a gradual SiGe layer, which is the ion-implanting area and in which the average Ge content is around 20%. Outside the area is non ion-implanting. From FIG. 4, the epitaxial layer structure according to the version of the invention may confine the threading dislocation in a specific area.

According to the principle of the invention, an active area and a non-active area are defined through ion implanting. The destruction occurring in the non active areas through ion implanting results in concentration of the threading dislocation of the active area in the non active area. Therefore, the threading dislocation density of the strain-relaxed SiGe epitaxial layer in the active area is obviously lowered. The dislocation is excluded outside the manufacturing area of components. Besides, the method according to the invention may be applied in a strained SiGe heterostructure CMOS.

It will be apparent to the person skilled in the art that the invention as described above may be varied in many ways, and notwithstanding remaining within the spirit and scope of the invention as defined in the following claims.

What is claimed is:

1. A method to fabricate a patterned strain-relaxed SiGe epitaxial layer with threading dislocation density control, comprising steps of:
   providing a semiconductor substrate;
   defining an ion-implanting area on the semiconductor substrate;
   implanting ions on the ion-implanting area;
   depositing a SiGe buffer layer on the ion-implanted semiconductor substrate and
   depositing a strain-relaxed SiGe epitaxial layer on the SiGe buffer layer.

2. The method of claim 1, wherein the SiGe buffer layer is deposited by gradual Ge.

3. The method of claim 1, wherein the strain-relaxed SiGe epitaxial layer is formed by the super vacuum chemical vapor deposition.

4. The method of claim 1, wherein the strain-relaxed SiGe epitaxial layer is formed by the molecule beam epitaxy growth method.

5. The method of claim 1, wherein the strain-relaxed SiGe epitaxial layer is formed by the low pressure chemical vapor deposition (LPCVD).

6. The method of claim 1, wherein the strain-relaxed SiGe epitaxial layer is formed by the rapid thermal chemical vapor deposition.

7. The method of claim 1, wherein a photo mask is used to exposure and develop for defining the ion-implanting area.

8. The method of claim 1, wherein the strain-relaxed SiGe epitaxial layer is deposited by constant Ge content.

9. The methods of claim 1, wherein the implanted ions cause the damage in the ion implanted region.

10. The method of claim 1, further comprises the step of annealing for the strain-relaxed SiGe epitaxial layer after depositing the strain-relaxed SiGe epitaxial layer.

11. A method to fabricate a patterned strain-relaxed SiGe epitaxial layer with threading dislocation density control, comprising steps of:
providing a semiconductor substrate;
defining an ion-implanting area on the semiconductor substrate;
implanting ions on the ion-implanting area;
depositing a first SiGe buffer layer on the ion-implanting area and the semiconductor substrate;
depositing a second SiGe buffer layer on the first SiGe buffer layer; and
depositing a strain-relaxed SiGe epitaxial layer on the ion-implanted semiconductor substrate.

12. The method of claim 11, wherein the second SiGe buffer layer is deposited by gradual Ge.

13. The method of claim 11, wherein a photo mask is used to exposure and develop for defining the ion-implanting area.

14. The method of claim 11, wherein the strain-relaxed SiGe epitaxial layer is deposited by constant Ge content.

15. The methods of claim 11, wherein the implanted ions cause the damage in the ion implanted region.

16. The method of claim 11, further comprises the step of annealing for the strain-relaxed SiGe epitaxial layer after depositing the strain-relaxed SiGe epitaxial layer.

* * * * *